United States Patent
Khoury

(10) Patent No.: US 6,359,454 B1
(45) Date of Patent: Mar. 19, 2002

(54) PICK AND PLACE MECHANISM FOR CONTACTOR

(75) Inventor: Theodore A. Khoury, Chicago, IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/368,002

(22) Filed: Aug. 3, 1999

(51) Int. Cl.[7] .............................................. G01R 31/02
(52) U.S. Cl. .................. 324/754; 324/158.1; 414/749.4
(58) Field of Search ................................ 324/754, 761, 324/762, 158.1; 414/416, 788.7, 795.2, 797, 796.9, 749.1, 749.4, 752.1

(56) References Cited

U.S. PATENT DOCUMENTS

| 5,513,430 A | 5/1996 | Yanof et al. |
| 5,557,214 A | 9/1996 | Barmett |
| 5,621,333 A | 4/1997 | Long et al. |
| 5,807,066 A | 9/1998 | Smith |
| 5,989,994 A | * 11/1999 | Khoury et al. ............... 438/615 |
| 6,043,563 A | 3/2000 | Eldridge et al. |

* cited by examiner

Primary Examiner—Ernest Karlsen
Assistant Examiner—Minh Tang
(74) Attorney, Agent, or Firm—Muramatsu & Associates

(57) ABSTRACT

A pick and place mechanism for assembling a large number of contactors on a contact substrate. The pick and place mechanism includes a first area for positioning an intermediate plate having a plurality of contactors thereon, a second area for positioning the contact substrate for receiving the contactors thereon, a carrier provided between the first and second areas for converting a direction of the contactor to a predetermined direction when receiving the contactor on a seat having an inclined back wall and a flat bottom surface, a first transfer mechanism for picking the contactor from the intermediate plate and placing the contactor on the seat of the carrier, a second transfer mechanism for picking the contactor from the seat of the carrier while maintaining the predetermined direction of the contactor defined by the carrier and placing the contactor on the contact substrate.

9 Claims, 6 Drawing Sheets

PICK AND PLACE MECHANISM FOR CONTACTOR

FIELD OF THE INVENTION

This invention relates to a pick and place mechanism for picking an object and placing the same on an intended position, and more particularly, to a pick and place mechanism for picking a micro contactor, changing the orientation of the contactor and placing the contactor on a substrate to mount the contactor thereon. Typically, the micro contactor in this invention is used in a probe card to test semiconductor wafers, semiconductor chips, packaged semiconductor devices or printed circuit boards and the like with an improved frequency bandwidth, pin pitch and contact performance and reliability.

BACKGROUND OF THE INVENTION

In testing high density and high speed electrical devices such as LSI and VLSI circuits, high performance contact structures, such as probe contactors or test contactors, must be used.

The inventors of this invention has introduced a unique contact structure in the U.S. Pat. No. 5,989,994. This invention is directed to a pick and place apparatus and method to be used in forming the contact structure shown in the patent application. This invention is also directed to a production process for producing the contact structure in a manner suitable for the operation of the pick and place apparatus of the present invention. The contact structure disclosed in the present invention is similar to that shown in the above noted U.S. Pat. No. 5,989,994, but has small differences therefrom.

In the application of semiconductor testing, circuit testing, or the like, the contactors produced through a microfabrication process must be mounted on a substrate such as a probe card to form a contact structure. However, because the size of the contactors is very small, it is not possible to manually handle the contactors in such an assembly process. Thus, there is a need of a pick and place mechanism for handling such small sized contactors for picking, changing the orientation, and placing the contactor on the substrate for bonding.

SUMMARY OF THE INVENTION

Therefore, it is an object of the present invention to provide a pick and place mechanism for handling the micro contactors for mounting the micro contactors on a substrate to form a contact structure.

It is another object of the present invention to provide a pick and place mechanism for picking, changing orientation, and placing the contactor to form a contact structure.

It is a further object of the present invention to provide a contact structure having a large number of micro contactors where each of the contactors has a triangle base to be attached to the substrate of the contact structure.

It is a further object of the present invention to provide a production process for producing micro contactors, each having a triangle base to be attached to a surface of the substrate forming the contact structure with use of a pick and place mechanism.

In the present invention, a contact structure for establishing an electrical connection with a contact target is formed with a substrate of a planar surface on which a plurality of contactors produced by a microfabrication process are mounted. In the present invention, the pick and place mechanism is utilized to assemble the contactors on the substrate by picking from an intermediate plate, changing orientations, placing the contactors on the substrate and bonding the contactors to the substrate.

The contact structure of the present invention has a contact substrate on which a plurality of contactors are mounted. Each of the contactors has a beam like shape formed through a semiconductor production process. The contactor is comprised of a silicon base having an inclined support portion created through an anisotropic etching process, an insulation layer formed on the silicon base and projected from the inclined support, and a conductive layer made of conductive material formed on the insulation layer so that a beam portion is created by the insulation layer and the conductive layer, wherein the beam portion exhibits a spring force when the tip of the beam portion is pressed against a contact target.

Another aspect of the present invention is a pick and place mechanism for assembling a large number of contactors on the contact substrate. The pick and place mechanism includes a first area for positioning an intermediate plate having a plurality of contactors thereon, a second area for positioning the contact substrate for receiving the contactors thereon, a carrier provided between the first and second areas for converting a direction of the contactor to a predetermined direction when receiving the contactor on a seat, a first transfer mechanism for picking the contactor from the intermediate plate and placing the contactor on the seat of the carrier, a second transfer mechanism for picking the contactor from the seat of the carrier while maintaining the predetermined direction of the contactor defined by the carrier and placing the contactor on the contact substrate for bonding.

A further aspect of the present invention is a process for producing the contact structures having a contact substrate on which a plurality of contactors are mounted. The method of producing the contact structure is comprised of the steps of providing a silicon substrate cut in a (100) crystal plane, forming a boron doped layer on a surface of the silicon substrate, forming a first insulation layer on the boron doped layer, forming a second insulation layer on a bottom surface of the silicon substrate, forming an etch window in the second insulation layer, performing an anisotropic etch through the etch window, and forming a conductive layer on the insulation layer, applying an intermediate plate under the silicon substrate so that a contactor produced in the foregoing process is transferred to the intermediate plate, picking the contactor from the intermediate plate and changing a direction of the contactor to a predetermined direction, and placing the contactor on the contact substrate with the predetermined direction and bonding the contactor to the contact substrate.

According to the present invention, the contact structure has a very high frequency bandwidth to meet the test requirements in the next generation semiconductor technology. Since the contact structure is formed by assembling the contactors on the substrate with the pick and place mechanism of the present invention, a large number of contactors can be aligned in a small space and in a predetermined direction, which is suitable for testing a large number of semiconductor devices at the same time.

Since the large number of contactors are produced at the same time on the substrate with the use of the microfabrication technology without involving manual handling, it is possible to achieve consistent quality, high reliability and long life in the contact performance. Further, because the probe contactors can be fabricated on the same substrate material as that of the device under test, it is possible to compensate the temperature expansion coefficient of the device under test, which is able to avoid positional errors.

DETAILED DESCRIPTION OF THE PREFERRED EMBODIMENT

The contact structure of the present invention is described with reference to FIGS. 1 and 2. Although slightly different, more detailed description of the contact structure and the variations thereof are given in the U.S. Pat. No. 5,989,994 owned by the same assignee of this invention.

Figure 1:
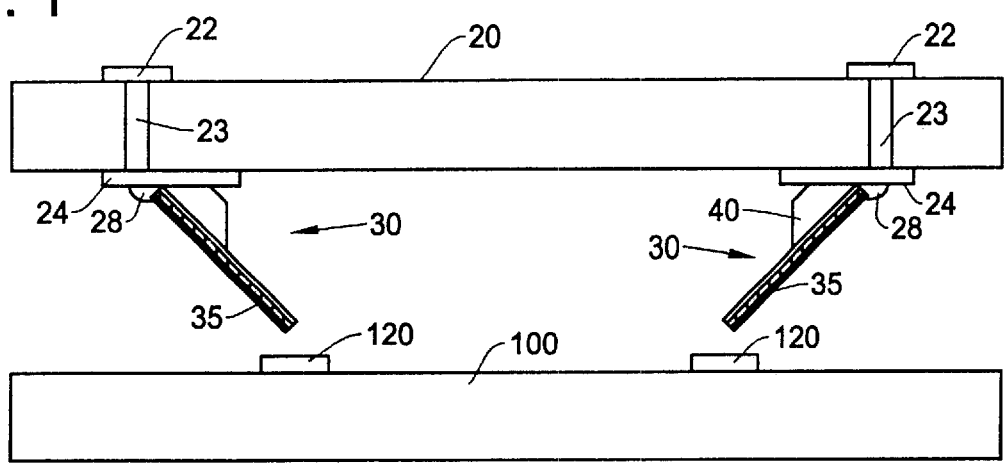
FIG. 1 is a schematic diagram showing contact structures of the present invention produced through a microfabrication process.

FIG. 1 shows an example of contact structure having a substrate 20 on which micro contactors 30 are mounted. The contactors 30 are produced through a microfabrication process, such as a photolithography process, and mounted on a contact substrate 20. In the semiconductor testing, the contact structure is positioned over a contact target such as a semiconductor wafer 100 to be tested and is pressed against the contact target. Thus, the contactors 30 establish electric communication with the semiconductor wafer 100. Although only two contactors 30 are shown in FIG. 1, a large number of contactors 30 are aligned on the substrate 20 in the contact structure when used in an actual semiconductor wafer test.

Such a large number of contactors are produced through the same semiconductor process and mounted on the silicon substrate (contact substrate) 20. When the semiconductor wafer 100 under test moves upward, the contactors 30 contact with corresponding contact targets (contact pads or electrodes) 120 on the wafer 100. The pitch between the pads 120 may be as small as 50 $\mu$m or less wherein the contactors 30 can easily be aligned in the same pitch since they are made through the same semiconductor production process as the wafer 100 are made.

The contactors 30 on the substrate 20 can be directly mounted on a probe card, or molded in a package, such as a traditional IC package having leads, so that the package is mounted on a probe card, or interconnected with other substrate. Since the contactors 30 can be fabricated in a very small size, an operable frequency range of a probe card mounting the contactors of the present invention can be easily increased to 2 GHz or higher. Because of the small size, the number of contactors on a probe card can be increased to, for example 2,000, which is able to test as many as 32 or more ICs such as memory devices in parallel at the same time.

Furthermore, because the contactors 30 are formed on the substrate 20, which is typically a silicon substrate, environmental changes such as a temperature expansion ratio of the silicon substrate are the same as those of the semiconductor wafer 100 under test. Therefore, the accurate positioning between the contactors 30 and the contact targets 120 can be maintained throughout the test.

In the contact structure of FIG. 1, the contactor 30 has a conductive layer 35 in a finger (beam) like shape. The contactor 30 also has a base 40 which is attached to the substrate 20. An interconnect trace 24 is connected to the conductive layer 35 at the bottom of the substrate 20. Such a connection between the interconnect trace 24 and the conductive layer 35 is made, for example, through a solder bump 28, or other bonding methods.

The substrate 20 further includes a via hole 23 and an electrode 22. The electrode 22 is to interconnect the contact substrate 20 to an external structure such as a probe card or IC package through a wire or lead. Thus, when the semiconductor wafer 100 moves upward, the contactors 30 and the contact targets 120 on the wafer 100 mechanically and electrically contact with each other. Consequently, a signal path is established from the contact target 120 to the electrode 22 on the substrate 20. The interconnect trace 24, the via hole 23 and the electrode 22 also function to fan-out the small pitch of the contactors 30 to a larger pitch to fit to the probe card or IC package.

Because of the spring force of the beam like shape of the contactor 30, the end of the conductive layer 35 produces a sufficient contact force when the semiconductor wafer 100 is pressed against the substrate 20. The end of the conductive layer 35 is preferably sharpened to achieve a scrubbing effect when pressed against the contact target 120, thereby achieving penetration through a metal-oxide layer. For example, if the contact target 120 on the wafer 100 has aluminum oxide on its surface, the scrubbing effect is necessary to establish the electric contact with low contact resistance.

The spring force derived from the beam like shape of the contact structure 30 provides an appropriate contact force against the contact target 120. The elasticity produced by the spring force of the contact structure 30 also functions to compensate the differences in size or the fluctuation of flatness (planarization) involved in the substrate 20, the contact target 120 and the wafer 100, as well as the contactors 30 of the contact structure.

Examples of material of the conductive layer 35 of the contactor 30 include nickel, aluminum, copper, nickel palladium, rhodium, nickel gold, iridium or several other depositable materials. An example of size of the contact structure 30 intended for a probe-test application may be 100–500 $\mu$m in overall height, 100–800 $\mu$m in horizontal length, and about 30–50 $\mu$m in width for the pitch of 50 $\mu$m or more between contact targets 120.

Figure 2:
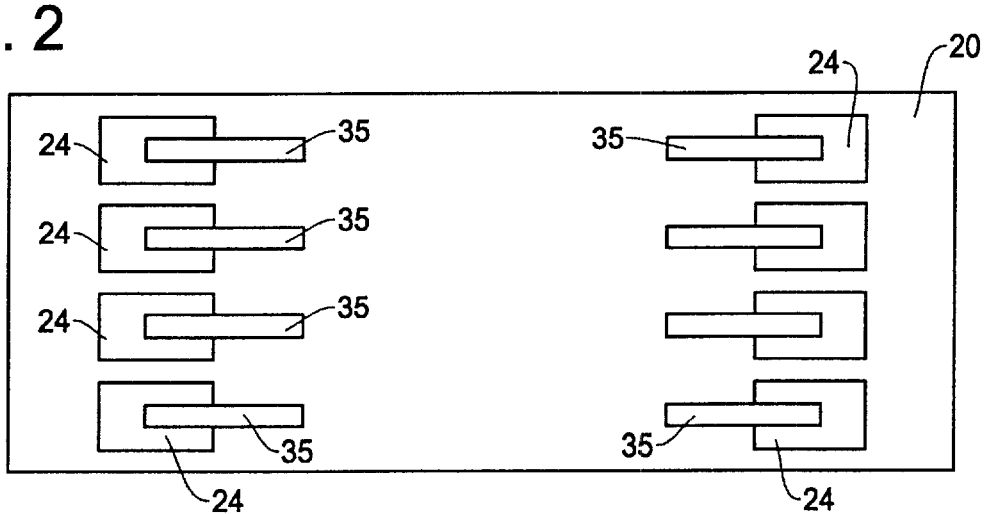
FIG. 2 is a schematic diagram showing a bottom view of the contact structure of FIG. 1.

FIG. 2 is a bottom view of the contact substrate 20 of FIG. 1 having a plurality of contactors 30. In an actual system, a larger number of contactors, such as several hundreds of them, will be aligned in various forms such as shown in FIG.

2. Each set of the interconnect trace 24, the via hole 23 and the electrode 22 establishes a signal path from the tip of the conductive layer 35 as well as functions to fan-out the small pitch of the contactors 30 to a larger pitch to fit to the probe card or IC package.

Figure 3:
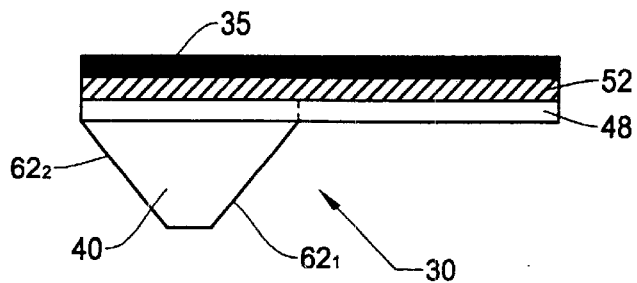
FIG. 3 is a schematic diagram showing an enlarged view of the contactor of the present invention.

FIG. 3 shows a more detailed view of the contactor 30 of the present invention. In the cross sectional front view of FIG. 3, the contactor 30 includes a silicon base 40, a boron doped layer 48, an insulation layer 52, and a conductive layer 35. The silicon base 40 has a triangle shape formed of two inclined portions $62_1$ and $62_2$ to support the finger like portion of the contactor 30 when mounted on the substrate 20 of FIGS. 1 and 2. As will be explained later, the triangle shape of the silicon base 40 is produced through an anisotropic etching process in a specific crystalline. The boron doped layer 48 is to function as an etch stopper during the etching process. The insulation layer 52 is typically a silicon dioxide layer to electrically insulate the conductive layer 35 from the other parts of the contactor 30.

FIGS. 4A–4F are schematic cross sectional views showing an example of process for producing the contactors of the present invention. In this process, the contactor 30 having two inclined portions $62_1$, and $62_2$ is produced through the semiconductor production process. The inclined portion $62_2$ is used to define the angle of the beam (finger) of the contactor when mounted on a planar surface (directly or through a contact trace) of the contact substrate 20 as shown in FIG. 1 as will be explained later.

Figure 4A:
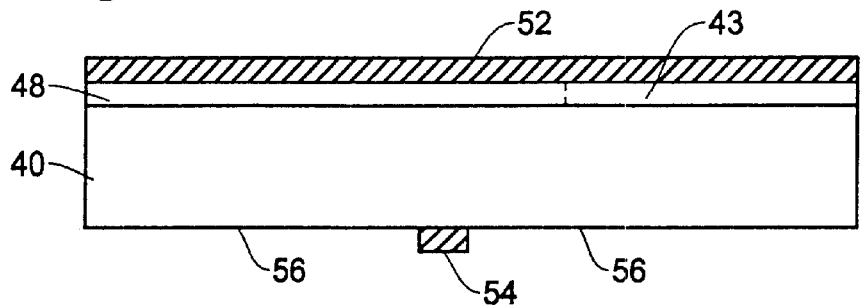
FIGS. 4A–4F are schematic diagrams showing an example of process for forming the contact structure of the present invention.

In FIG. 4A, a boron doped layer 48 is formed on a silicon substrate 40 wherein a specific (etch-out) area 43 is defined for which the boron is not doped. Although not shown, a photolithography process is performed for forming the boron doped layer 48 such as using a photoresist layer and a photomask as is well known in the art. The photoresist layer is exposed with ultraviolet light through a pattern on the photomask. Because of the photoresist, after the doping process, the boron doped layer 48 is formed wherein the specified areas 43 of the silicon substrate 40 are not doped with the boron. The boron doped layer 48 functions as an etch stopper as will be described later.

A dielectric layer such as a silicon dioxide $SiO_2$ layer is provided on the boron doped layer 48 to establish an insulation layer 52 for electrically isolating the conductive layer 35 of FIG. 3. A silicon dioxide $SiO_2$ layer 54 is also provided at the bottom of the silicon substrate 40 as an etch mask. Etch windows 56 are defined by removing the silicon dioxide layer 54 except the central portion thereof in FIG. 4A through a photolithography process (not shown). In this example, the etch windows 56 are formed at both sides of the central portion of the dioxide layer 54. The etch windows 56 allow an anisotropic etch therethrough.

The anisotropic etch process is performed on the silicon substrate 40. As is known in the art, in the case where the silicon substrate 40 is cut in a (100) crystal plane, an inclined etch surface is formed through the anisotropic etching when etchant is provided at the etching windows 56. The angle of the inclination is 54.7° relative to the bottom surface of the silicon substrate 40. This angle is the same as a (111) crystal plane of the silicon substrate 40. An example of etchant for this purpose includes EDP (ethylene diamine pyrocatechol), TMAH (tetra methyl ammonium hydroxide) and KOH (potassium hydroxide).

Figure 4B:
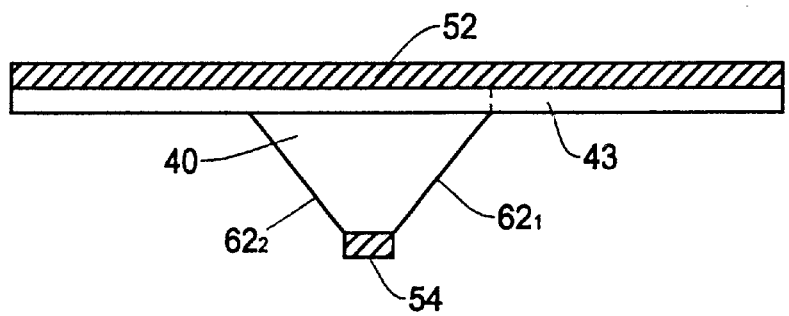

Thus, the anisotropic etch process creates angled portions $62_1$, and $62_2$ along with the (111) crystal plane of the silicon substrate 40 as in FIG. 4B. As noted above, this angle is 54.7° with respect to the bottom surface of silicon substrate 40. Alternatively, the inclined portion $62_2$ can be made by dicing the silicon substrate 40 rather than the etching process noted above. Because the specified areas 43 are not doped with the boron, the silicon substrate in these areas are etched away, leaving the finger (comb) like structure at both sides of the silicon substrate 40 as shown in FIG. 4B.

Figure 4C:
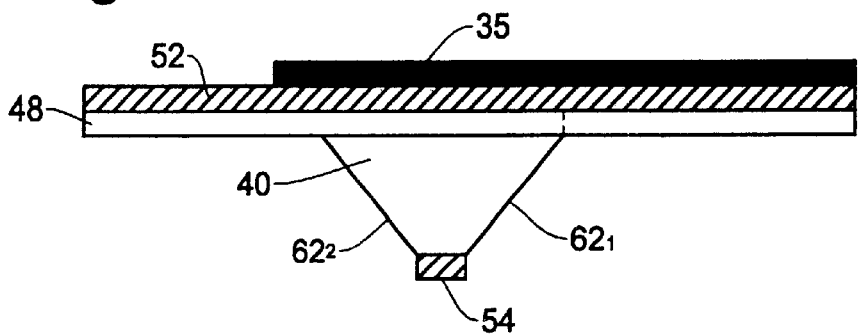

In FIG. 4C, a plating seed layer (not shown) is formed on the silicon dioxide layer 52. A further photolithography process is performed to form a photoresist layer (not shown) so that a conductive layer 35 is created through a plating process. An example of material in the conductive layer 35 includes nickel, aluminum and copper. Alternatively, a variety of deposition techniques can be used in producing the conductive layer 35 including vacuum evaporation, cathode sputtering, vapor-phase deposition.

Figure 4D:
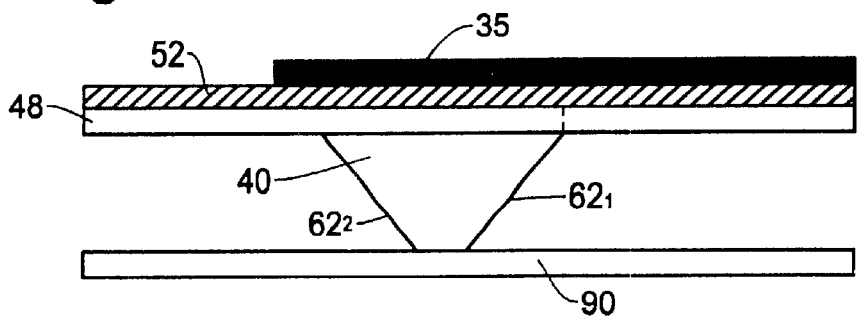
Figure 4E:
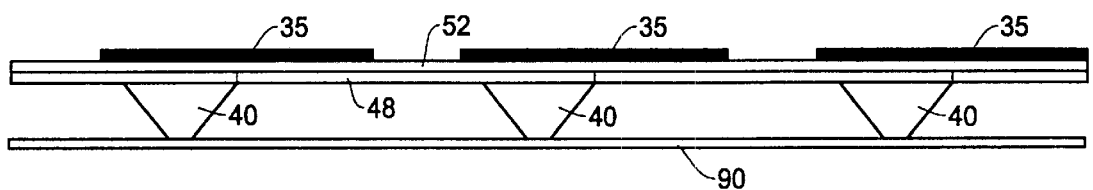
Figure 4F:
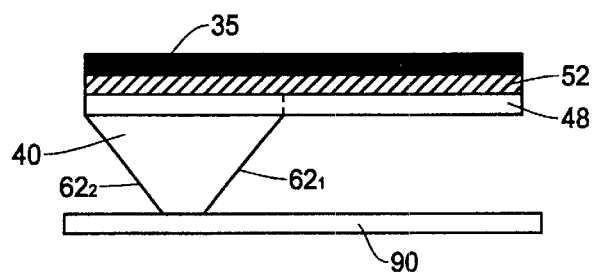

In FIG. 4D, the silicon dioxide layer 54 is removed and an intermediate plate 90 such as an adhesive tape is provided at the bottom of the silicon substrate (base) 40. Since a large number of contactors 30 are produced in the foregoing process at the same time, the large number of contactors are attached to the intermediate plate 90 in a manner shown in FIG. 4E. The purpose of the intermediate plate 90 is to maintain the position and posture of each of the contactors 30 so the contactors 30 can be conveniently mounted on the contact substrate 20 of FIG. 1 by the pick and place mechanism of the present invention. Therefore, the intermediate plate is a flat plate which can fit the contactors thereon, for example, an adhesive tape, an adhesive film, an adhesive plate, a magnetic plate, a plate coated with polymer, and the like. In FIG. 4F, each contactor 30 or each group of contactors 30 is separated from the other by, for example, dicing.

Figure 5A:
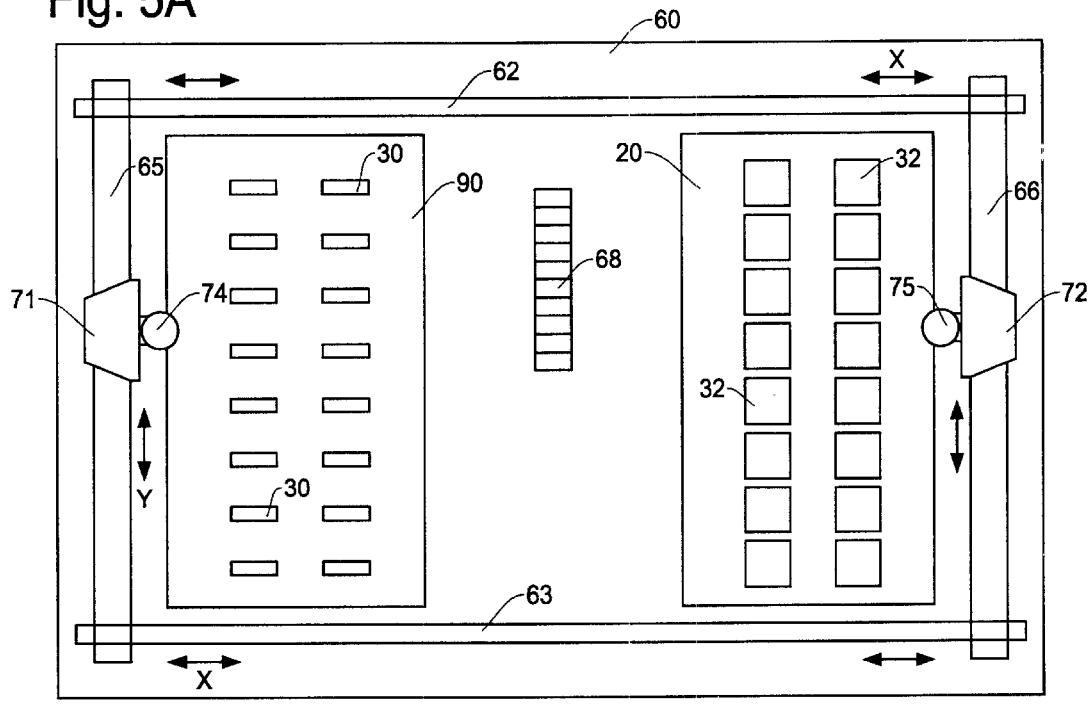
FIG. 5A is a schematic diagram showing a plan view of the pick and place mechanism of the present invention.
Figure 5B:
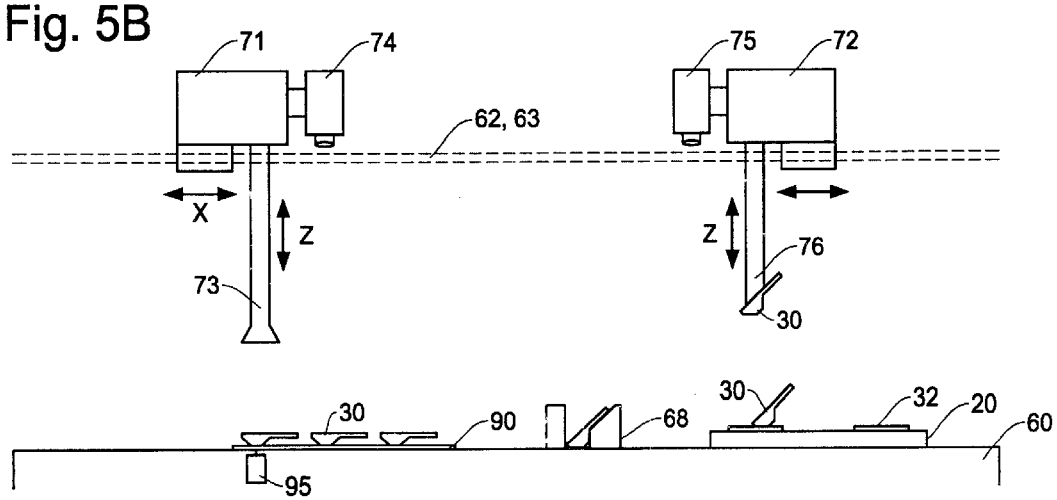
FIG. 5B is a schematic diagram showing a front view of the pick and place mechanism of the present invention.

FIGS. 5A and 5B are schematic diagrams showing an example of pick and place mechanism and its process for picking the contactors 30 and placing the same on a substrate 20 to form a contact structure. FIG. 5A is a top view of a pick and place mechanism 60 of the present invention and FIG. 5B is a front view of the pick and place mechanism 60. The pick and place mechanism 60 picks the contactor 30 on the intermediate plate 90 and places the contactor 30 in a carrier for changing the orientation of the contactor 30. The pick and place mechanism 60 picks the contactor 30 again and places the same on the bonding location 32 of the substrate 20 so that the contactor 30 be mounted on the bonding locations 32 by a bonding machine.

In this example, the pick and place mechanism 60 is comprised of a first transfer mechanism 71 to pick, transfer and place the contractor 30, a mobile arm 65 to allow movements of the transfer mechanism 71 in a Y direction, a second transfer mechanism 72 to pick, transfer and place the contactor 30, a mobile arm 66 to allow movements of the transfer mechanism 72 in the Y direction, and rails 62 and 63 to allow movements of the mobile arms 65 and 66 in an X direction. Thus, the transfer mechanisms 71 and 72 are freely moveable in the X and Y directions on the pick and place mechanism 60. In FIGS. 5A and 5B, the pick and place mechanism 60 further includes a carrier (direction converter) 68 for receiving the contactors 30 and converting the direction (orientation) of the same.

The first transfer mechanism 71 includes a suction arm 73 that performs suction (pick) and suction release (place) operations for the contactor 30. The suction force is created, for example, by a negative pressure such as vacuum. The suction arm 15 moves in a Z (up-down or vertical) direction as shown in FIG. 5B. Similarly, the second transfer mechanism 72 includes a suction arm 76 that performs suction (pick) and suction release (place) operations for the contactors 30. The suction arm 76 moves in the Z direction as shown in FIG. 5B.

As shown in FIGS. 5A and 5B, cameras 74 and 75, having, for example CCD image sensors, are respectively attached to the transfer mechanism 71 and 73 to acquire image data on the surface of the pick and place mechanism to accurately control the movements of the transfer mechanism 71 and 72. Although not shown, a controller such as a microcomputer is provided which controls the overall operation of the pick and place mechanism based on the image data from the image sensors (cameras) 74 and 75.

In operation, the intermediate plate 90 having the contactors 30 and the substrate 20 having the bonding locations 32 are respectively positioned in first and second areas on the pick and place mechanism 60. Preferably, the intermediate plate 90 and the substrate 20 are placed on XYZ stages (not shown), respectively, to be able to fine adjust their positions in X, Y and Z directions. As shown in FIG. 5A, the transfer mechanism 71 picks the contactor 30 from the intermediate plate 90 by the suction force produced at the tip of the suction arm 73 and places the same on the carrier 68.

The carrier 68 has one or more seats which are specifically structured to receive the contactors 30 in such a way that the orientation of the contactor 30 is changed to be directly mounted on the substrate 20. Namely, when placed on the carrier 68, the contactor 30 is inclined by the angle of the inclined portion $62_2$ of FIG. 3, i.e., 54.7° relative to the surface of the pick and place mechanism. The details of the carrier 68 will be explained later. After placing the predetermined number of contactors 30 or immediately after placing at least one contactor on the seat of the carrier 68, the transfer mechanism 72 approaches the carrier 68 and picks the contactor 30 whose orientation has been changed.

The tip of the suction arm 76 of the transfer mechanism 72 is specially structured as will be explained later. The transfer mechanism 73 picks the contactor 30 in the carrier 68 by the suction force of the suction arm 76. As noted above, because of the carrier 68, the contactor 30 is inclined relative to the horizontal surface of the pick and place mechanism 60. The transfer mechanism 72 picks the contactor 30 while maintaining the angle thereof defined by the carrier 68 and places the contactor 30 on the bonding location 32 on the substrate 20. The contactor 30 is bonded to the bonding location 32 through a bonding process in a known manner. Thus, the inclined portion $62_2$ of the contactor 30 is connected to the planar surface of the bonding location 32 so that the contactor 30 is oriented in the angle 54.7° as shown in FIGS. 1 and 5B.

Figure 6:
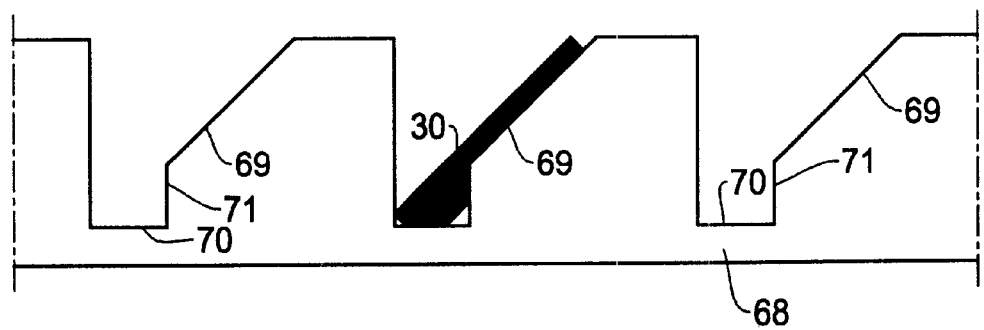
FIG. 6 is a schematic diagram showing a cross sectional front view of the carrier in the pick and place mechanism of the present invention.

FIG. 6 shows a cross sectional front view of the carrier 68 in the pick and place mechanism 60 of the present invention. The carrier 68 in this example has a plurality of seats to accommodate two or more contactors 30. Each seat has a flat bottom 70, a vertical wall 71 and an inclined back wall 69 for changing the orientation of the contactor 30 when receiving the same. The inclined back wall 69 is formed at the upper end of the vertical wall 71. Namely, when the contactor 30 is picked by the suction arm 73 of the transfer mechanism 71, the contactor 30 is in the horizontal direction, i.e., parallel with the surface of the pick and place mechanism 60. When the contactor 30 is positioned over the seat of the carrier 68 and released from the suction arm 73, the contactor 30 is placed on the inclined back 69 and the flat bottom 70. The inclined portion $62_2$ of the contactor 30 meets the flat bottom 70, the other inclined portion $62_1$ of the contactor 30 meets the vertical wall 71, and the finger (beam) portion of the contactor 30 meets the inclined back 69. Accordingly, the contactor 30 is changed its orientation in the predetermined degree, i.e, 54.7° in this example, as shown in FIG. 6.

Figure 7:
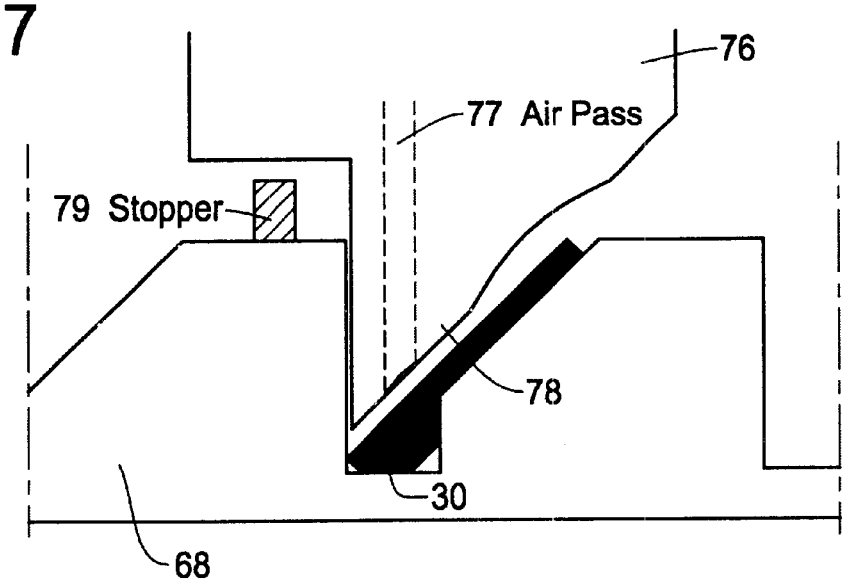
FIG. 7 is a diagram showing a cross sectional front view of the carrier and the suction tip of the pick and place mechanism of the present invention.

FIG. 7 shows a cross sectional front view of the carrier 68 and the suction tip of the suction arm 76. The suction arm 76 has a suction tip 78 which has the same angle as the orientation of the contactor 30 in the carrier 68. Thus, when the suction arm 76 picks the contactor 30 by the suction force, the predetermined orientation of the contactor 30 is maintained. A stopper 79 is provided to stop the downward movement of the suction arm 76, thereby protecting the contactor 30 in the seat. The contactor 30 is picked by the suction arm 76 and is transferred to the substrate 20 and is placed on the bonding position 32 where it is bonded to the substrate 20.

Figure 8:
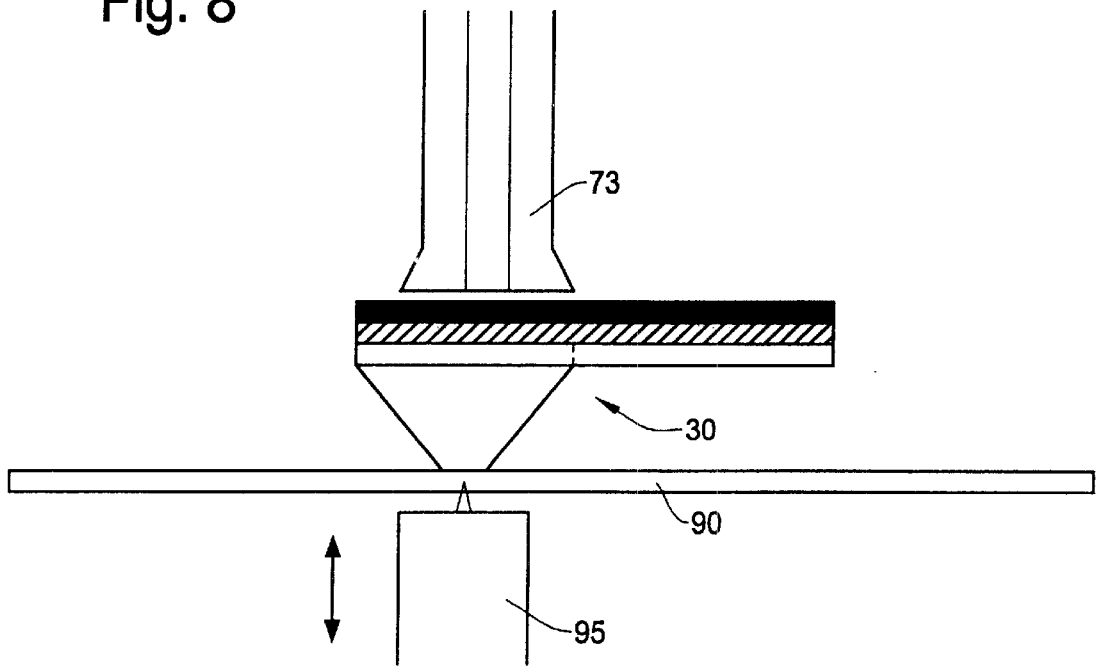
FIG. 8 is a schematic diagram showing a cross sectional front view of an eject head mechanism for releasing the contactors from the intermediate plate in the pick and place mechanism of the present invention.

FIG. 8 is a schematic diagram showing a cross sectional front view of an eject head mechanism for releasing the contactor 30 from the intermediate plate 90 such as an adhesive tape in the pick and place mechanism 60 of the present invention. The pick and place mechanism 60 includes an eject head 95 whose horizontal position is controlled in the same way as the transfer mechanism 71. The ejected head 95 is also controlled to perform an up-down movement in synchronism with the movement of the suction arm 73. In this example, the eject head 95 has a sharp point at the top thereof which can penetrate through the intermediate plate 90. When the suction arm 73 picks the contactor 30, the eject head 95 moves upward to press the contactor 30 through the intermediate plate 90, thereby easily removing the contactor 30 from the intermediate plate 90.

According to the present invention, the contact structure has a very high frequency bandwidth to meet the test requirements of next generation semiconductor technology. Since the contact structure is formed by assembling the contactors on the substrate with the pick and place mechanism of the present invention, a large number of contactors can be aligned in a small space and in a predetermined direction which is suitable for testing a large number of semiconductor devices at the same time.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A pick and place mechanism for producing a contact structure by assembling contactors on a contact substrate, comprising:

a first area for positioning an intermediate plate having a plurality of contactors adhered thereon through adhesive;

a second area for positioning the contact substrate for receiving the contactors thereon;

a carrier provided between the first and second areas for converting a direction of the contactor to a predetermined direction when receiving the contactor on a seat;

a transfer mechanism for picking the contactor from the intermediate plate and placing the contactor on the seat of the carrier and for picking the contactor from the seat of the carrier while maintaining the predetermined inclined direction of the contactor defined by the carrier and placing the contactor on the contact substrate;

wherein said carrier has an upper opening for receiving the contactor on said seat and a flat bottom which meets a base portion of the contactor and a vertical wall erected from the bottom surface and an inclined back wall at the top end of the vertical wall, and wherein said inclined back wall meets a beam portion of the contactor, thereby specifying the predetermined direction of the contactor.

2. A pick and place mechanism as defined in claim 1, wherein an angle of said inclined back wall in said carrier corresponds to an anisotropic etch angle of the base portion of the contactor.

3. A pick and place mechanism as defined in claim 1, wherein the transfer mechanism is configured by a first transfer mechanism for picking the contactor from the intermediate plate and placing the contactor on the seat of the carrier and a second transfer mechanism for picking the contactor from the seat of the carrier while maintaining the predetermined direction of the contactor defined by the carrier and placing the contactor on the contact substrate.

4. A pick and place mechanism as defined in claim 1, wherein the intermediate plate is a flat plate which is formed with an adhesive tape, an adhesive film, an adhesive plate, a magnetic plate, or a plate coated with polymer.

5. A pick and place mechanism as defined in claim 3, wherein the first transfer mechanism is movable in a horizontal plane over the intermediate plate and has a first suction arm having a first suction tip which is movable in a vertical direction for picking and placing the contactor by a suction force, and the second transfer mechanism is movable in a horizontal plane over the contact substrate and has a second suction arm having a second suction tip which is movable in a vertical direction for picking and placing the contactor by the suction force.

6. A pick and place mechanism as defined in claim 5, further comprising an eject head provided in the first area under the intermediate plate to press the contactor upward through the intermediate plate such that the adhesion between the contactor and the intermediate plate is weakened so that the contactor is easily separated from the intermediate plate and is picked by the first suction arm from the intermediate plate.

7. A pick and place mechanism as defined in claim 6, wherein said eject head has a needle at its top which pierces the intermediate plate to press the contactor upwardly through the intermediate plate to separate the contactor from the intermediate plate.

8. A pick and place mechanism as defined in claim 3, the first transfer mechanism includes a first image sensor and the second transfer mechanism includes a second image sensor for respectively acquiring position data on the first and second pick and place mechanism.

9. A pick and place mechanism as defined in claim 3 wherein the second transfer mechanism has a suction tip which is inclined in an angle identical to the angle of the inclined back wall of the carrier so that the suction tip is in parallel with an upper surface of the beam portion of the contactor on the carrier when picking the contactor from the carrier.

\* \* \* \* \*